US012707994B2

(12) United States Patent
Mazzola et al.

(10) Patent No.: US 12,707,994 B2
(45) Date of Patent: Aug. 11, 2026

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventors: Mauro Mazzola, Calvenzano (IT); Fabio Marchisi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 618 days.

(21) Appl. No.: 18/101,983

(22) Filed: Jan. 26, 2023

(65) Prior Publication Data

US 2023/0245955 A1 Aug. 3, 2023

(30) Foreign Application Priority Data

Feb. 1, 2022 (IT) ........................ 102022000001649

(51) Int. Cl.
*H10W 70/40* (2026.01)
*B23K 26/0622* (2014.01)
(Continued)

(52) U.S. Cl.
CPC ....... *H10W 70/465* (2026.01); *B23K 26/0622* (2015.10); *B23K 26/21* (2015.10); *H10W 90/811* (2026.01); *H10W 90/756* (2026.01)

(58) Field of Classification Search
CPC ......... H01L 24/32; H01L 24/34; H01L 24/37; H01L 24/40; H10W 72/07635;
(Continued)

(56) References Cited

U.S. PATENT DOCUMENTS 6,580,161 B2 6/2003 Kobayakawa
9,184,148 B2 11/2015 Jeon et al.
(Continued)

FOREIGN PATENT DOCUMENTS

CN 101356633 A 1/2009
CN 102194806 A 9/2011
(Continued)

OTHER PUBLICATIONS

IT Search Report and Written Opinion for priority application, IT Appl. 102022000001649, report dated Sep. 19, 2022, 8 pgs.
(Continued)

*Primary Examiner* — Mary A Wilczewski
(74) *Attorney, Agent, or Firm* — Crowe & Dunlevy LLC

(57) ABSTRACT

A semiconductor device includes an electrically conductive clip arranged in a bridge-like position between a semiconductor integrated circuit chip and an electrically conductive pad of a leadframe. The electrically conductive clip is soldered to the semiconductor integrated circuit chip and to the electrically conductive pad via soldering material applied at coupling surfaces facing towards the semiconductor integrated circuit chip and the electrically conductive pad. Prior to soldering, the clip is immobilized in the desired bridge-like position via one of welding (such as laser welding) or gluing at dedicated immobilization areas.

23 Claims, 4 Drawing Sheets

(51) Int. Cl.
*B23K 26/21* (2014.01)
*H10W 90/00* (2026.01)

(58) Field of Classification Search
CPC ......... H10W 72/07636; H10W 90/756; H10W 90/811; B23K 26/21; B23K 26/0622
See application file for complete search history.

(56) References Cited

U.S. PATENT DOCUMENTS

2002/0066963 A1 6/2002 Embong et al.
2002/0096756 A1 7/2002 Kobayakawa
2002/0125562 A1 9/2002 Crowley et al.
2003/0075785 A1 4/2003 Crowley et al.
2006/0110856 A1 5/2006 Kasem et al.
2007/0290336 A1 12/2007 Sun et al.
2008/0173991 A1 7/2008 Cruz et al.
2009/0121331 A1* 5/2009 Cruz ........................ H01L 24/95 257/676
2011/0008936 A1 1/2011 Tellkamp
2012/0119343 A1 5/2012 Bayan et al.
2014/0264804 A1 9/2014 Terrill et al.
2015/0221582 A1 8/2015 Miyakawa
2016/0336257 A1 11/2016 Choi
2016/0358843 A1 12/2016 Arokiasamy et al.
2017/0012012 A1 1/2017 Camenforte, III et al.
2017/0207150 A1 7/2017 Choi
2017/0250125 A1 8/2017 Arokiasamy et al.
2017/0278774 A1* 9/2017 Hayashi ............ H01L 23/49562
2018/0240770 A1 8/2018 Choi
2018/0331022 A1 11/2018 Qin et al.
2019/0189545 A1 6/2019 Boettcher et al.
2020/0144162 A1 5/2020 Chaowasakoo et al.
2020/0211937 A1 7/2020 Saito
2020/0227279 A1 7/2020 Umeda et al.
2021/0013170 A1 1/2021 Kamiyama
2021/0090980 A1 3/2021 Noquil et al.
2021/0183751 A1* 6/2021 Clemente ............ H01L 23/4334
2021/0202269 A1 7/2021 Baelio et al.
2021/0265243 A1 8/2021 Kuraya et al.
2022/0028762 A1 1/2022 Chaowasakoo et al.
2022/0115308 A1 4/2022 Noquil et al.
2022/0352056 A1 11/2022 Bajuri et al.
2023/0170322 A1* 6/2023 Rafael, Jr. ......... H01L 23/49562 257/666
2023/0245955 A1* 8/2023 Mazzola ................. H01L 24/84 257/676
2023/0245994 A1* 8/2023 Mazzola ................. H01L 24/92
2024/0170375 A1 5/2024 Tsukuda et al.
2024/0178179 A1* 5/2024 Mazzola ........... H01L 23/49513

FOREIGN PATENT DOCUMENTS

CN 104979320 A 10/2015
CN 219591387 U 8/2023
DE 112020001100 T5 1/2022
EP 4220692 A1 * 8/2023 ............. H01L 21/60
EP 4220693 B1 * 11/2024 ............. H01L 24/48
JP 3314768 B2 8/2002
JP 5857361 B2 2/2016
WO WO 2007/052199 * 5/2007 ............. H01L 34/32

OTHER PUBLICATIONS

CN First Office Action and Search Report for counterpart CN Appl. No. 202310047032.6, report dated Jul. 18, 2025, 9 pgs.

* cited by examiner

18
LB
LB
180
18A
22
180
12B 18
180
1800
18A
180
1800
V 18A
180
1800

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102022000001649 filed on Feb. 1, 2022, the content of which is hereby incorporated by reference in its entirety to the maximum extent allowable by law.

TECHNICAL FIELD

The description relates to semiconductor devices. One or more embodiments can be applied advantageously to power semiconductor devices.

BACKGROUND

Various types of semiconductor devices with a plastic package comprise: a substrate (leadframe) having one or more semiconductor integrated circuit chips or dice arranged thereon; electrically conductive formations (wires, ribbons, clips) coupling the semiconductor chip(s) to leads (outer pads) in the substrate; and an insulating encapsulation (e.g., a resin) molded on the assembly thus formed to complete the plastic body of the device.

In a power semiconductor device, the current transferred from the high-power section to the output pads of the device can be significant and ribbons or clips are used for that purpose in the place of wires. Wires can still be used to provide electrical coupling to a low-power section (e.g., a controller) in the device.

Ribbons are placed using essentially a wire bonder process. Clips are placed with a clip attach equipment, and a solder paste is used to connect the clip to pad and die. Solder curing in an oven is applied to provide a solid connection of clips to pad and die.

Conventional clip attachment equipment facilitates achieving an adequate accuracy in chip placement as the clip is applied on die and pad, after which the assembly is transferred to an oven for solder curing. During this handling and curing process, clips may become displaced from a desired correct position. This may result in a defective final product. Solder thickness and the tendency of the clip to "float" on solder in a fluid state may also lie at the basis of undesired excessive clip tilt.

There is accordingly a need in the art to contribute to adequately addressing the issues discussed in the foregoing.

SUMMARY

One or more embodiments relate to a method. One or more embodiments may relate to a corresponding semiconductor device.

One or more embodiments may provide one or more of the following advantages: accurate clip positioning is facilitated throughout the assembly process with undesired movement (e.g., rotation) effectively countered; and solder thickness can be adequately controlled.

In an embodiment, a method comprises: arranging at least one semiconductor chip on a die pad in a substrate, the substrate comprising at least one electrically conductive pad by the die pad; positioning at least one electrically conductive clip in a bridge-like position between the at least one semiconductor chip and the at least one electrically conductive pad, wherein, in said bridge-like position, the at least one electrically conductive clip has coupling surfaces facing towards the at least one semiconductor chip and the at least one electrically conductive pad; and soldering the at least one electrically conductive clip in said bridge-like position to the at least one semiconductor chip and to the at least one electrically conductive pad to provide electrical coupling therebetween, wherein soldering is via soldering material at said coupling surfaces. In addition, the method comprises, prior to said soldering, immobilizing the at least one electrically conductive clip in said bridge-like position via welding or gluing to at least one of the electrically conductive pads and the at least one semiconductor chip.

In an embodiment, a device comprises: at least one semiconductor chip on a die pad in a substrate, the substrate comprising at least one electrically conductive pad by the die pad; at least one electrically conductive clip positioned in a bridge-like position between the at least one semiconductor chip and the at least one electrically conductive pad, the at least one electrically conductive clip having coupling surfaces facing towards the at least one semiconductor and the at least one electrically conductive pad; and solder material applied at said coupling surfaces of the at least one electrically conductive clip in said bridge-like position, the solder material electrically coupling the at least one electrically conductive clip to the at least one semiconductor chip and to the at least one electrically conductive pad. In addition, the at least one electrically conductive clip is fixed in said bridge-like position to at least one of the electrically conductive pads and the at least one semiconductor chip via welding, preferably laser welding, or gluing in addition to said solder material.

BRIEF DESCRIPTION OF THE DRAWINGS

One or more embodiments will now be described, by way of example only, with reference to the annexed figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

For simplicity and ease of explanation, throughout this description, like parts or elements are indicated in the various figures with like reference signs, and a corresponding description will not be repeated for each and every figure.

In current manufacturing processes of semiconductor devices, plural devices are manufactured concurrently to be separated into single individual device in a final singulation. For simplicity and ease of explanation, the following description will refer to manufacturing a single device.

Figure 1:
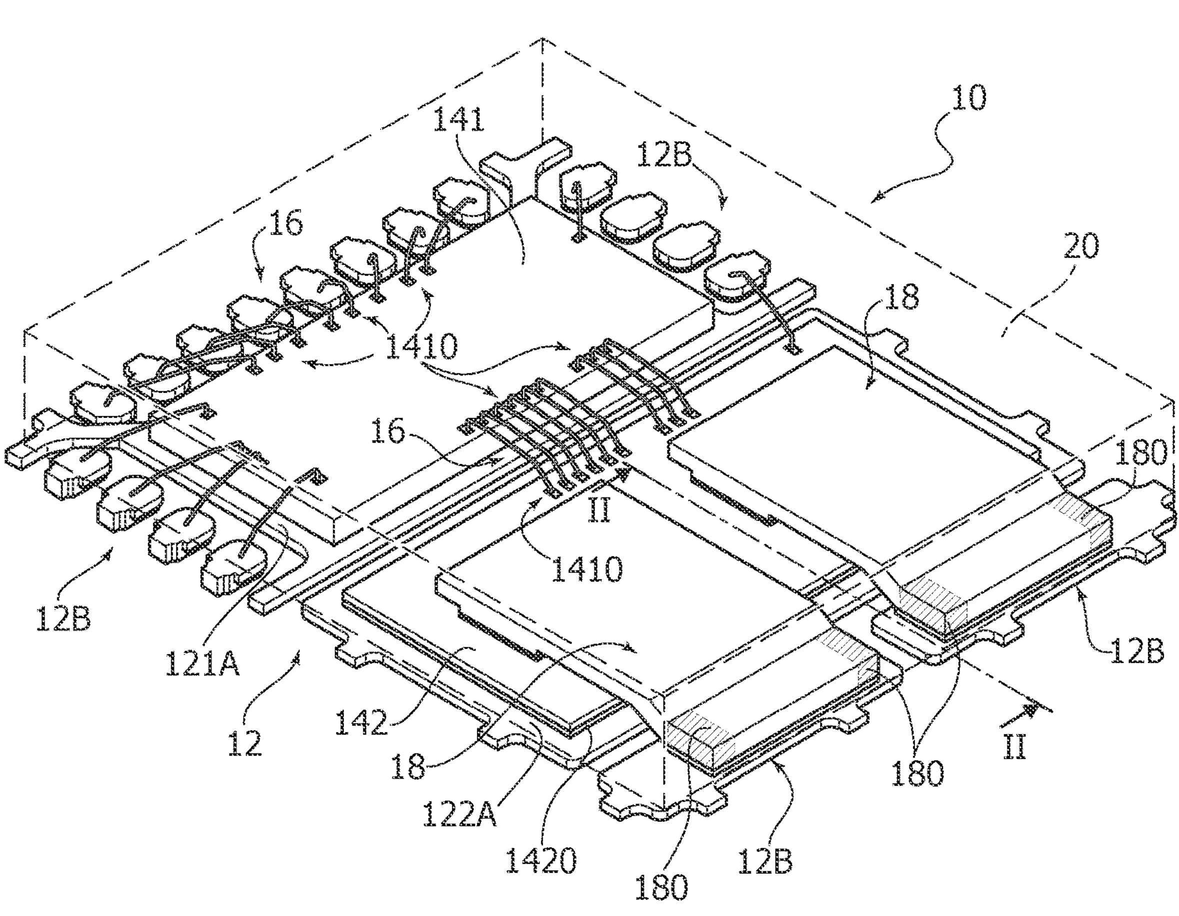
FIG. 1 is a perspective view of a power semiconductor device.

FIG. 1 is exemplary of a power semiconductor device 10 with a plastic package.

As conventional in the art, the device 10 comprises a substrate (leadframe) 12 having arranged thereon one or more semiconductor integrated circuit chips or dice. As used herein, the terms chip/s and die/dice are regarded as synonymous.

The figures illustrate by way of example a semiconductor power device 10 comprising a low-power section (e.g., a controller integrated circuit die 141) attached on a first die pad 121A in the leadframe 12 and a high-power section (e.g., one or more power integrated circuit dice 142) attached on one or more die pads 122A in the lead frame 12, with an array of leads 12B around the die pads 121A, 122A having the dice 141 and 142 mounted thereon.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Essentially, a leadframe comprises an array of electrically-conductive formations (or leads, e.g., 12B) that from an outline location extend inwardly in the direction of a semiconductor chip or die (e.g., 141, 142) thus forming an array of electrically-conductive formations from a die pad (e.g., 121A, 122A) configured to have at least one semiconductor chip or die attached thereon. This may be via conventional means such as a die attach adhesive 1420 (a die attach film (DAF), for instance).

A device 10 as illustrated in FIG. 1 is intended to be mounted on a substrate such as a printed circuit board (PCB—not visible in the figures), using solder material, for instance.

Electrically conductive formations are provided to electrically couple the semiconductor chip(s) 141, 142 to selected ones of the leads (outer pads) 12B in the leadframe 12.

As illustrated, these electrically conductive formations comprise wire bonding patterns 16 coupling the low-power section (chip 141) to selected ones of the leads 12B and to the high-power section (chip or chips 142. These wire bonding patterns 16 are coupled to die pads 1410 provided at the front or top surfaces of the chips 141 and 142.

Conversely, so-called clips 18 are used to couple the high-power section (chip or chips 142) to selected ones of the leads 12B acting as (power) output pads of the device 10.

Using clips 18 in the place of wires as included in the wire bonding patterns 16 (used to provide electrical coupling to a low-power section e.g., a controller 141) takes into account the fact that the current transferred from the high-power section 142 to the output pads in a power semiconductor device may be significant. As noted, wires such as the wires 16 are still used to provide electrical coupling to a low-power section (e.g., a controller) in the device.

An insulating encapsulation 20 (e.g., an epoxy resin) is molded on the assembly thus formed to complete the plastic body of the device 10.

While the device 10 as shown comprises two clips 18, certain devices may comprise just one clip or more than two clips.

To this point, a device structure as discussed is more or less conventional in the art, which makes it unnecessary to provide a more detailed description herein.

To summarize, for the purposes herein, producing the device 10 as discussed herein involves: arranging at least one semiconductor chip 142 on a die pad 12A in a substrate 12 that comprises at least one electrically conductive pad 12B by (that is, adjacent or sidewise) the die pad 12A; and positioning at least one electrically conductive clip 18 in a bridge-like position between the at least one semiconductor chip 142 and the at least one electrically conductive pad 12B.

In such a bridge-like position, the electrically conductive clip 18 has coupling surfaces facing towards the semiconductor chip 142 and the electrically conductive pad 12B.

The electrically conductive clip 18 positioned in said bridge-like position is soldered to the semiconductor chip 142 and to the electrically conductive pad 12B to provide electrical coupling therebetween.

As illustrated, soldering is via soldering material 22 dispensed (in a manner known per se to those of skill in the art) at said coupling surfaces. The soldering material 22 is consolidated (in a manner likewise known per se to those of skill in the art), e.g., via heat treatment in an oven.

As discussed, clips such as the clip 18 are placed using a clip attach equipment and a solder paste 22 is used to connect the clip to pad and die. Solder curing in an oven is applied to provide a solid connection of the clips 18 to pad (e.g., 12B) and die (e.g., 142).

Conventional clip attachment equipment facilitates achieving an adequate accuracy in chip placement as a clip 18 is applied bridge-like between a die such as the die 142 and a respective pad/lead such as the pad/lead 12A: this case is considered for simplicity; in certain devices an individual clip 18 may be coupled, e.g., to plural pads/leads.

After clip placement the assembly is transferred to an oven for solder curing. During this handling and curing process clips may become displaced from a desired correct position, which may result in a defective final product.

The thickness of the solder 22 and the tendency of the clip to "float" on the solder 22 in a fluid state may also lie at the basis of undesired excessive clip tilt.

Undesired clip movement (displacement) can be attempted to be countered by adding fixing features in the clip and leadframe design.

Smooth handling may also help along with very accurate clip centering in clip placement.

Selecting solder paste materials countering undesired clip floating properties can also be considered.

None of these solutions appears fully satisfactory, for various reasons.

For instance, certain features added to the clip/leadframe design can be space-consuming, which may suggest reducing pad dimensions and/or using larger package dimensions to gain space, neither of which is attractive/desirable.

Handling of the parts involved is already achieved in a fairly gentle manner and further improvement in that direction are hardly conceivable.

Selecting solder paste materials different from those conventionally used may have negative effects in terms of thermal and electrical performance.

In examples as considered herein-prior to soldering—the clip or clips 18 are immobilized in the desired bridge-like position via welding (e.g., laser welding) or gluing at one or more dedicated immobilization areas, e.g., as generally indicated by reference 180 in FIG. 1.

As discussed in the following, the immobilization areas 180 can be suitably formed and shaped, e.g., by coining, in order to be configured to facilitate welding or gluing of the clip(s) 18.

Examples as considered herein are thus based on the concept of "tacking" or "basting" the coupling of the clip(s) 18 to chip(s) 142 and the pad(s) or lead(s) 12B in the desired bridge-like position so that the clip(s) are immobilized and retained in such a position during soldering, thus countering undesired displacement (e.g., translation/rotation/tilt).

In various examples this involves stepped lateral portions of a clip 18 resting on the leadframe 12 (e.g., at a lead or pad 12B) and providing flat areas of contact for the laser welding or the gluing of the clip 18.

Figure 2:
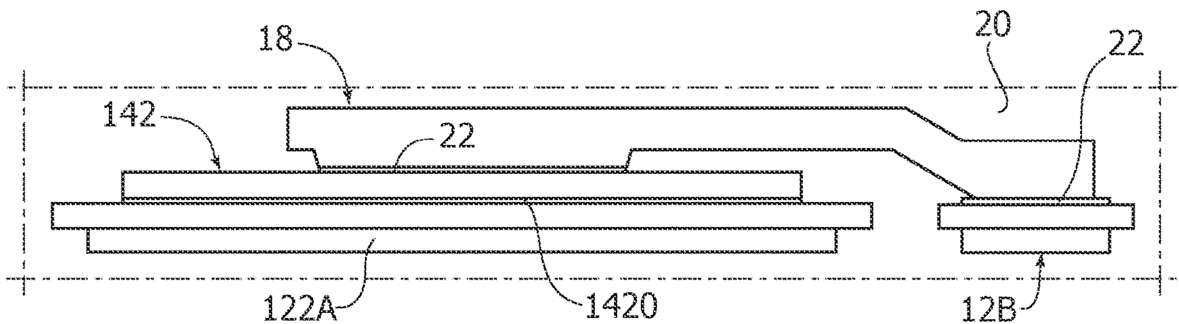
FIG. 2 is a sectional view along line II-II of FIG. 1.
Figures 3, 4, 5:
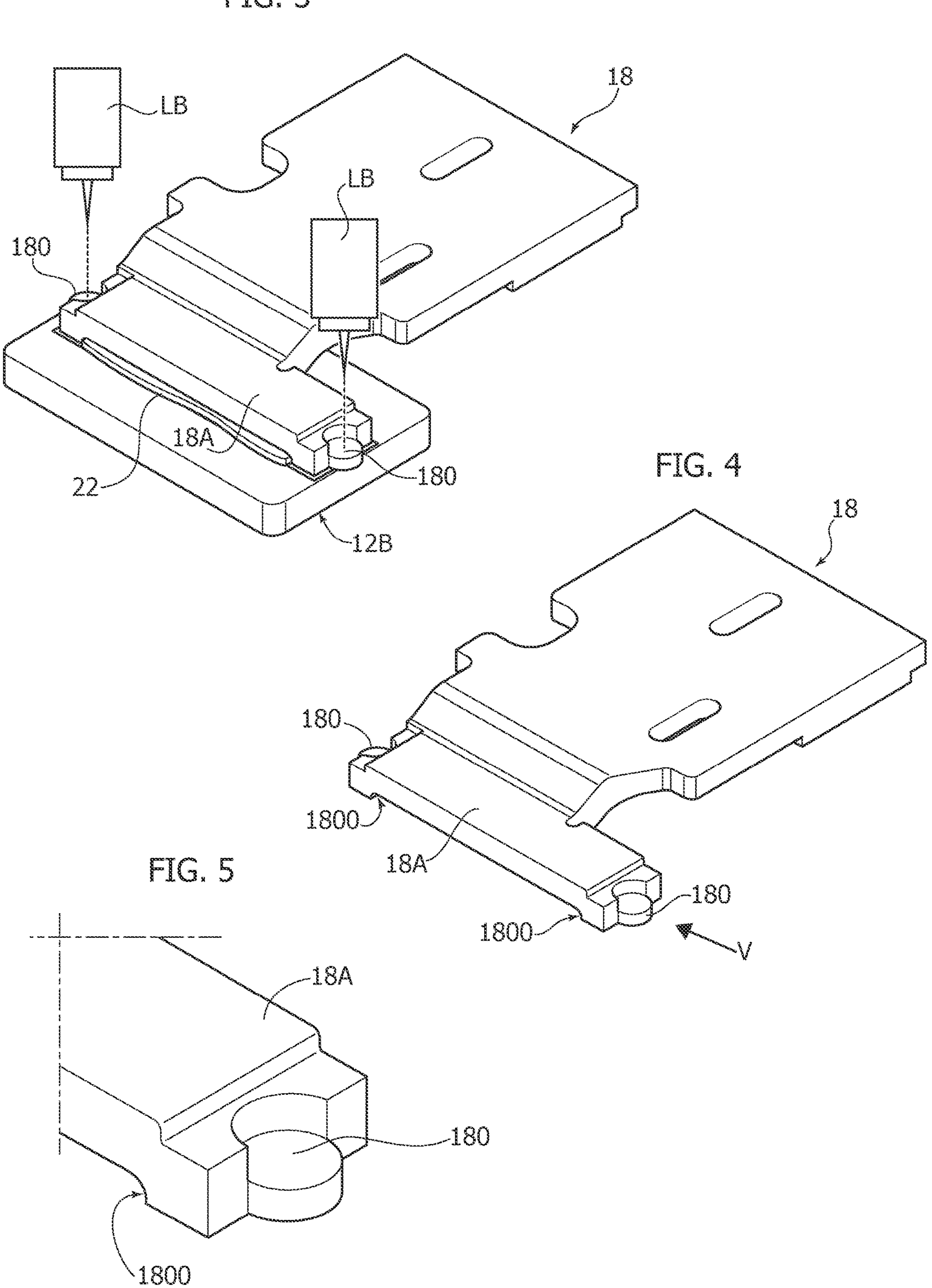
FIG. 3 illustrates a possible way of implementing embodiments of the present description in elements (clips) of a device as illustrated in FIGS. 1 and 2.
FIG. 4 is a perspective view of the modified element of FIG. 3, shown in isolation.
FIG. 5 is a view of the portion of FIG. 4 indicated by arrow V, reproduced on an enlarged scale.
Figure 6:
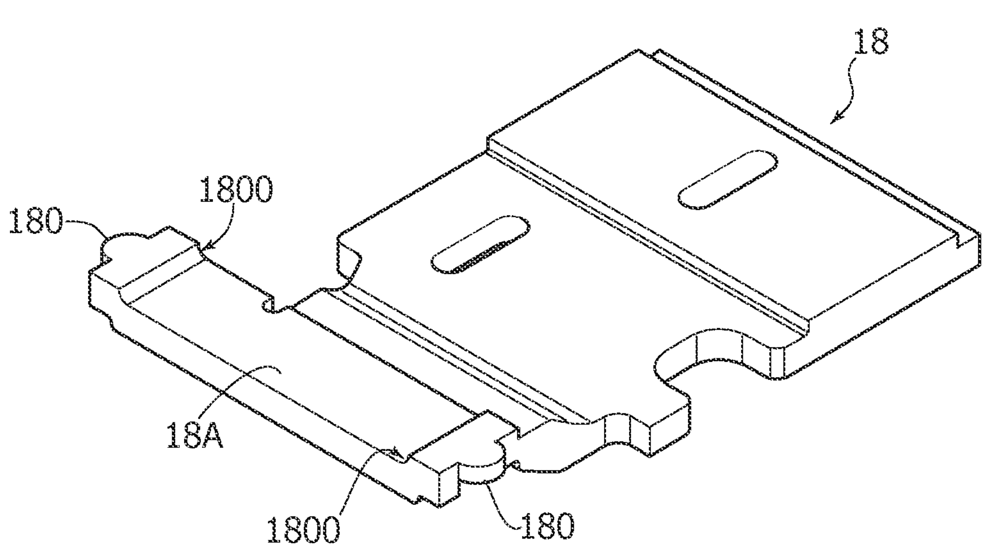
FIG. 6 is a perspective view of the element illustrated in FIG. 4 observed from a different viewpoint.

FIGS. 3 to 6 are exemplary of the possibility of modifying a clip 18 as illustrated in FIGS. 1 and 2 in such a way to facilitate "tacking" or "basting" the coupling of the clip(s) 18 by laser welding as exemplified by references LB in FIG. 3.

Figure 7:
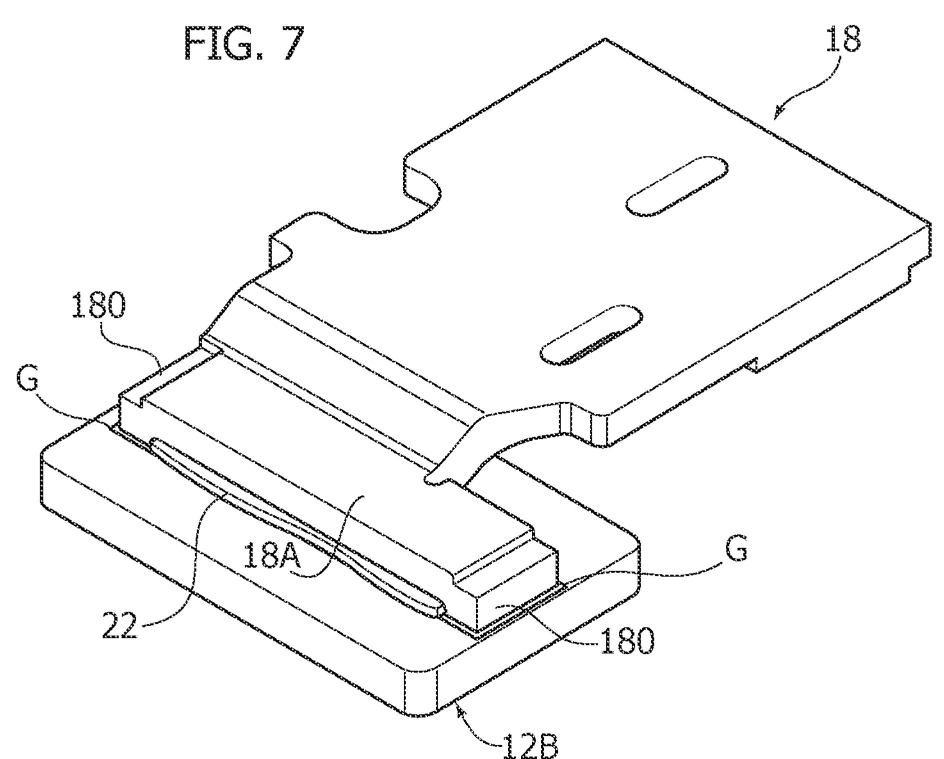
FIG. 7 illustrates another possible way of implementing embodiments of the present description in elements (clips) of a device as illustrated in FIGS. 1 and 2.
Figure 8:
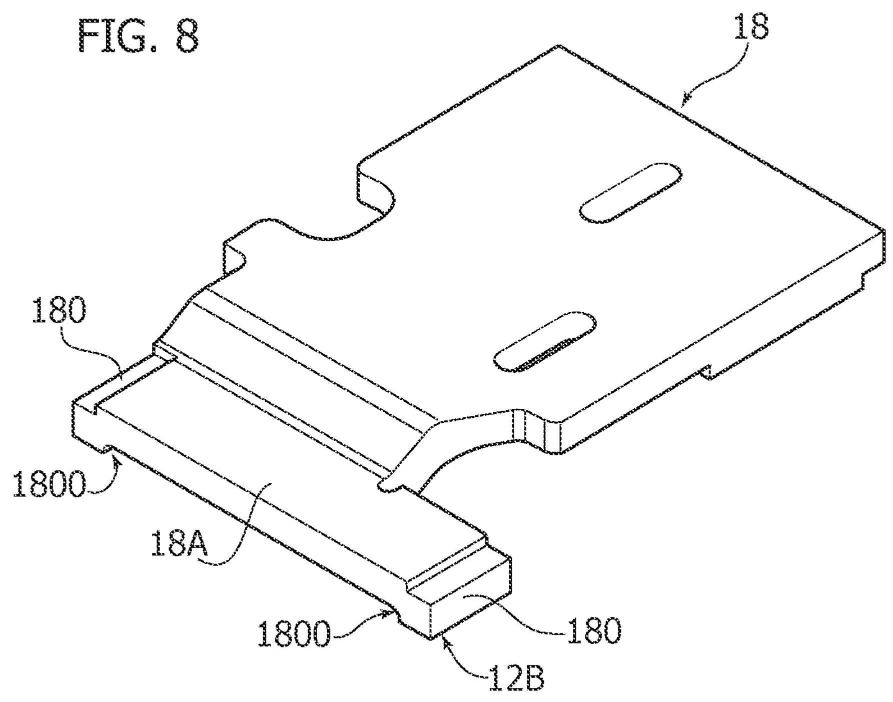
FIG. 8 is a perspective view of the modified element of FIG. 3, shown in isolation.
Figure 9:
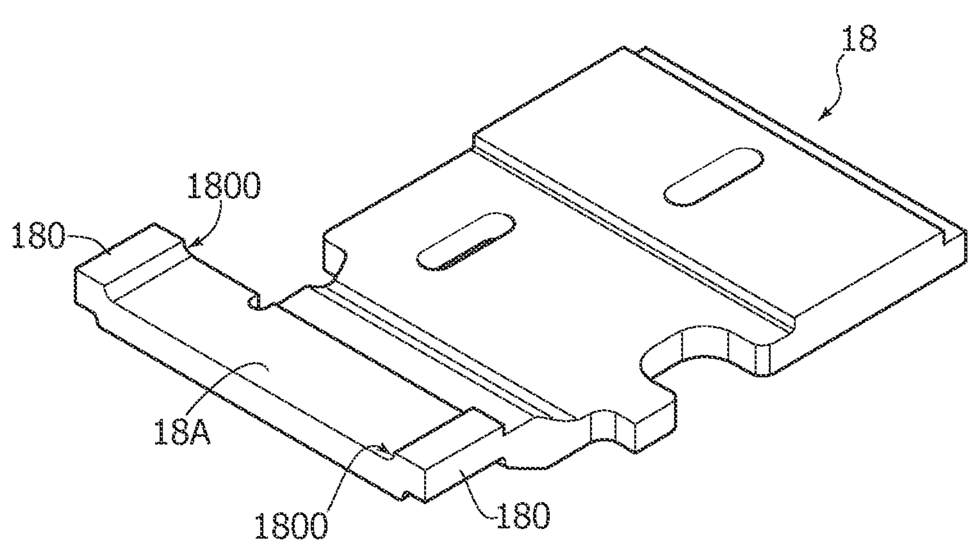
FIG. 9 is a perspective view of the element illustrated in FIG. 7 observed from a different viewpoint.

FIGS. 7 to 9 are exemplary of the possibility of modifying a clip 18 as illustrated in FIGS. 1 and 2 at the areas or regions 180 in such a way to facilitate "tacking" or "basting" the coupling of the clip(s) 18 by gluing as exemplified by the reference G in FIG. 7.

In either case (laser welding, gluing) the fact is taken into account that solder material 22 is provided to facilitate electrical coupling of the clip 18 to the lead 12B.

In order to avoid undesired detachment/displacement of the clip 18 with respect to the desired bridge-like coupling position one or more dedicated clip areas 180 to be used to apply (micro dot) laser welding LB-FIGS. 3 to 6—or gluing G (via, e.g., the glue available under the trade designation Loctite® 3609 with Henkel AG& Co KGaA-FIGS. 7 to 9.

In that way, the clip 18 can be pre-fixed through laser welding after clip attach to the clip bar. Such micro-welding facilitates robust clip positioning until the solder paste 22, after melting, carries out the brazing.

Additionally, the clip(s) 18 maintain the die 141 well placed during reflow avoiding translation and rotation.

Flat welding areas 180 at the clip edges also facilitate clip planarity, which results in improved results in board-level testing (BLT) as compared with conventional processes.

Specific welding areas such as those indicated by the reference 180 in FIGS. 3 to 6 can be realized (by coining, for instance) when manufacturing a clip bar.

The points above also apply identically to dedicated clip areas 180 intended for gluing as represented in FIGS. 7 to 9.

Glue drops as indicated by reference G in FIG. 7 can be dispensed on a leadframe clip bar in addition to solder paste, with glue curing taking place during pre-heating in a reflow tunnel oven. Such gluing facilitates robust clip positioning until the solder paste 22, after melting, carries out the brazing.

Additionally, glue bonded clip(s) 18 maintain the die 141 well placed during reflow.

Improved clip planarity is again facilitated as compared with conventional processes.

In both instances (laser welding, gluing) clip and die are maintained in a desired position during assembly processes.

As illustrated, throughout the figures, clips such as the clips 18 exhibit (in manner known per se) a bent shape with a distal portion 18A configured to be coupled to the lead(s) 12B and thus at least slightly downset to allow for the thickness of the chip 142.

Advantageously, the dedicated "tacking" or "basting" (laser welding, gluing) areas 180 are provided at such distal portion 18A.

Advantageously, a pair of such areas 180 are provided at opposed ends of the distal portion 18A.

As visible in figures such as FIG. 4 or FIG. 8, the area(s) 180 at least slightly protrude from the general plane of the (distal portion 18A of) clip 18. This results in containment walls (indicated by reference 1800 in FIGS. 4, 5, 6, 8, and 9) being formed that facilitate containment of solder paste 22 as visible in FIGS. 3 and 7.

In that way, once the area(s) 180 are fixed (welded or glued) to the lead 12B, a gap is formed between the remainder of the distal portion 18A and the lead 12B.

As visible in figures such as FIG. 3 or FIG. 7, solder paste 22 in a molten state can penetrate into such a gap to provide a solder layer of controlled thickness.

The shape of the areas 180 was not found to represent per se a critical parameter.

As illustrated in FIGS. 3 to 6, a round shape was however found to be advantageous for areas 180 intended for laser welding LB.

As illustrated in FIGS. 7 to 9, a rectangular (or square) shape was found to be advantageous for areas 180 intended for gluing G.

Examples as presented herein facilitate maintaining a precise clip "centering" during assembly processes.

Undesired clip movement and rotation are avoided, and solder thickness can be adequately controlled.

In examples as presented herein, dedicated welding/gluing areas 180 are shown formed at the clip end 18A intended to cooperate with a pad/lead 12B in the leadframe 12.

In principle (at least insofar as gluing is concerned) such areas 180 could be formed also or only at the opposed end of the clip 18, that is at the end intended to cooperate with the chip 141.

It is noted that the presence of the dedicated welding/gluing areas 180 will be noticeable also in the final device, where the clip(s) 18 will be fixed in the desired bridge-like position by the joint action of: the solder material 22; and laser welds (recognizable as such) or masses of glue as used to immobilize the clip during soldering.

Without prejudice to the underlying principles, the details and embodiments may vary, even significantly, with respect to what has been described by way of example only without departing from the extent of protection.

The claims are an integral part of the technical teaching on the embodiments as provided herein.

The extent of protection is determined by the annexed claims.

The invention claimed is:

1. A device, comprising:

a substrate comprising an electrically conductive pad and a die pad;

a semiconductor integrated circuit chip mounted to the die pad of the substrate;

an electrically conductive clip positioned in a bridge-like position between the semiconductor integrated circuit chip and the electrically conductive pad, the electrically conductive clip having coupling surfaces facing towards the semiconductor integrated circuit chip and the electrically conductive pad;

solder material applied at said coupling surfaces of the electrically conductive clip in said bridge-like position, the solder material electrically coupling the electrically conductive clip to the semiconductor integrated circuit chip and to electrically conductive pad; and a laser weld in addition to said solder material that fixes the electrically conductive clip in said bridge-like position to the electrically conductive pad.

2. The device of claim 1, wherein the electrically conductive clip comprises a dedicated immobilization area where the laser weld or glue is applied.

3. The device of claim 2, wherein the dedicated immobilization area protrudes from the electrically conductive clip to form a lateral containment wall for said soldering material.

4. The device of claim 2, wherein the dedicated immobilization area is planar.

5. The device of claim 4, wherein the dedicated immobilization area has one of a round or quadrangular shape.

6. The device of claim 2, wherein the dedicated immobilization area is provided in a distal portion of the electrically conductive clip.

7. The device of claim 6, wherein the distal portion of the electrically conductive clip is downset relative to a portion of the electrically conductive clip adjacent a top surface of the semiconductor integrated circuit chip.

8. The device of claim 6, further comprising a pair of dedicated immobilization areas at opposed ends of said distal portion of the electrically conductive clip.

9. The device of claim 1, wherein the semiconductor integrated circuit chip is a power semiconductor integrated circuit, and wherein the electrically conductive clip is sized and dimensioned to carry current produced by the power semiconductor integrated circuit.

10. A device, comprising:

a substrate comprising an electrically conductive pad and a die pad;

a semiconductor integrated circuit chip mounted to the die pad of the substrate;

an electrically conductive clip positioned in a bridge-like position between the semiconductor integrated circuit chip and the electrically conductive pad, the electrically conductive clip having coupling surfaces facing towards the semiconductor integrated circuit chip and the electrically conductive pad;

wherein the coupling surface of the electrically conductive clip facing towards the electrically conductive pad includes a protruding portion defining a containment wall;

a weld at the containment wall to fix the electrically conductive clip to the electrically conductive pad; and solder material applied at said coupling surfaces of the electrically conductive clip in said bridge-like position, the solder material electrically coupling the electrically conductive clip to the semiconductor integrated circuit chip and to electrically conductive pad;

wherein the solder material at the electrically conductive pad is contained by the containment wall.

11. The device of claim 10, wherein the weld comprises a laser weld.

12. The device of claim 10, wherein the semiconductor integrated circuit chip is a power semiconductor integrated circuit, and wherein the electrically conductive clip is sized and dimensioned to carry current produced by the power semiconductor integrated circuit.

13. A device, comprising:

a substrate comprising an electrically conductive pad and a die pad;

a semiconductor integrated circuit chip mounted to the die pad of the substrate;

an electrically conductive clip positioned in a bridge-like position between the semiconductor integrated circuit chip and the electrically conductive pad, the electrically conductive clip having coupling surfaces facing towards the semiconductor integrated circuit chip and the electrically conductive pad;

wherein the coupling surface of the electrically conductive clip facing towards the electrically conductive pad includes a protruding portion defining a containment wall;

a glue spot at the containment wall to fix the electrically conductive clip to the electrically conductive pad; and solder material applied at said coupling surfaces of the electrically conductive clip in said bridge-like position, the solder material electrically coupling the electrically conductive clip to the semiconductor integrated circuit chip and to electrically conductive pad;

wherein the solder material at the electrically conductive pad is contained by the containment wall.

14. The device of claim 13, wherein the semiconductor integrated circuit chip is a power semiconductor integrated circuit, and wherein the electrically conductive clip is sized and dimensioned to carry current produced by the power semiconductor integrated circuit.

15. A device, comprising:

a substrate comprising an electrically conductive pad and a die pad;

a semiconductor integrated circuit chip mounted to the die pad of the substrate;

an electrically conductive clip positioned in a bridge-like position between the semiconductor integrated circuit chip and the electrically conductive pad, the electrically conductive clip having coupling surfaces facing towards the semiconductor integrated circuit chip and the electrically conductive pad;

solder material applied at said coupling surfaces of the electrically conductive clip in said bridge-like position, the solder material electrically coupling the electrically conductive clip to the semiconductor integrated circuit chip and to electrically conductive pad; and an electrically insulating glue in addition to said solder material that fixes the electrically conductive clip in said bridge-like position to at least one of the electrically conductive pad and the semiconductor integrated circuit chip.

16. The device of claim 15, wherein the electrically conductive clip comprises a dedicated immobilization area where the electrically insulating glue is applied.

17. The device of claim 16, wherein the dedicated immobilization area protrudes from the electrically conductive clip to form a lateral containment wall for said soldering material.

18. The device of claim 16, wherein the dedicated immobilization area is planar.

19. The device of claim 18, wherein the dedicated immobilization area has one of a round or quadrangular shape.

20. The device of claim 16, wherein the dedicated immobilization area is provided in a distal portion of the electrically conductive clip.

21. The device of claim 20, wherein the distal portion of the electrically conductive clip is downset relative to a portion of the electrically conductive clip adjacent a top surface of the semiconductor integrated circuit chip.

22. The device of claim 20, further comprising a pair of dedicated immobilization areas at opposed ends of said distal portion of the electrically conductive clip.

23. The device of claim 15, wherein the semiconductor integrated circuit chip is a power semiconductor integrated circuit, and wherein the electrically conductive clip is sized and dimensioned to carry current produced by the power semiconductor integrated circuit.

* * * * *